(12) United States Patent
Noquil et al.

(10) Patent No.: US 11,784,114 B2
(45) Date of Patent: Oct. 10, 2023

(54) PLATED METAL LAYER IN POWER PACKAGES

(71) Applicant: TEXAS INSTRUMENTS INCORPORATED, Dallas, TX (US)

(72) Inventors: Jonathan Almeria Noquil, Plano, TX (US); Makarand Ramkrishna Kulkarni, Dallas, TX (US); Osvaldo Jorge Lopez, Annandale, NJ (US); Yiqi Tang, Allen, TX (US); Rajen Manicon Murugan, Dallas, TX (US); Liang Wan, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 84 days.

(21) Appl. No.: 17/334,491

(22) Filed: May 28, 2021

(65) Prior Publication Data
US 2022/0181241 A1 Jun. 9, 2022

Related U.S. Application Data

(60) Provisional application No. 63/122,903, filed on Dec. 8, 2020.

(51) Int. Cl.
*H01L 23/498* (2006.01)
*H01L 23/00* (2006.01)

(52) U.S. Cl.
CPC .. *H01L 23/49822* (2013.01); *H01L 23/49844* (2013.01); *H01L 24/13* (2013.01); *H01L 24/16* (2013.01); *H01L 2224/13147* (2013.01); *H01L 2224/16238* (2013.01)

(58) Field of Classification Search
CPC ......... H01L 23/49822; H01L 23/49844; H01L 24/13; H01L 24/16; H01L 2224/13147; H01L 2224/16238; H01L 2224/0603; H01L 2224/16225; H01L 2224/48465; H01L 2224/49111; H01L 2224/49171;
(Continued)

(56) References Cited

U.S. PATENT DOCUMENTS

| | | | |
|---|---|---|---|
| 2016/0276174 A1* | 9/2016 | Kim | H01L 23/5389 |
| 2020/0118949 A1* | 4/2020 | Moallem | H01L 25/16 |
| 2020/0243434 A1* | 7/2020 | Lee | H01L 23/49534 |

(Continued)

FOREIGN PATENT DOCUMENTS

WO WO-2020166567 A1 * 8/2020 ......... H01L 21/4857

*Primary Examiner* — Douglas W Owens
(74) *Attorney, Agent, or Firm* — Dawn Jos; Frank D. Cimino

(57) ABSTRACT

In some examples, a semiconductor package comprises a multi-layer package substrate. The multi-layer package substrate includes first and second metal layers, the first metal layer positioned above the second metal layer and coupled to the second metal layer by way of a via. The substrate also includes a dielectric covering at least part of the first and second metal layers and the via. The package includes a plated metal layer plated on at least part of the first metal layer and positioned above the dielectric, a combination of the first metal layer and the plated metal layer being thicker than the second metal layer. The package includes a semiconductor die having a device side, the device side vertically aligned with and coupled to the plated metal layer.

20 Claims, 5 Drawing Sheets

(58) Field of Classification Search
CPC ....... H01L 23/3107; H01L 2924/00014; H01L 2924/181
See application file for complete search history.

(56) References Cited

U.S. PATENT DOCUMENTS

2020/0373243 A1* 11/2020 Jang .................... H01L 23/5389
2021/0242164 A1* 8/2021 Nakamura .............. H01L 24/13

* cited by examiner

PLATED METAL LAYER IN POWER PACKAGES

CROSS-REFERENCE TO RELATED APPLICATIONS

The present application claims priority to U.S. Provisional Patent Application No. 63/122,903, which was filed Dec. 8, 2020, is titled "Flip Chip Routable Lead Frame With Elevated Trace," and is hereby incorporated herein by reference in its entirety.

BACKGROUND

Semiconductor chips are often housed inside packages that protect the chips from deleterious environmental influences, such as heat, moisture, and debris. A packaged chip generally communicates with electronic devices outside the package via conductive members (e.g., leads) that are exposed to surfaces of the package. Some packages include substrates on which the semiconductor die is positioned. The substrate may include multiple metal layers, or traces, that carry electrical signals or power.

SUMMARY

In some examples, a semiconductor package comprises a multi-layer package substrate. The multi-layer package substrate includes first and second metal layers, the first metal layer positioned above the second metal layer and coupled to the second metal layer by way of a via. The substrate also includes a dielectric covering at least part of the first and second metal layers and the via. The package includes a plated metal layer plated on at least part of the first metal layer and positioned above the dielectric, a combination of the first metal layer and the plated metal layer being thicker than the second metal layer. The package includes a semiconductor die having a device side, the device side vertically aligned with and coupled to the plated metal layer.

BRIEF DESCRIPTION OF THE DRAWINGS

For a detailed description of various examples, reference will now be made to the accompanying drawings in which.

DETAILED DESCRIPTION

As described, some semiconductor packages include substrates having multiple metal layers, or traces. These metal layers carry electrical data signals and/or power between the semiconductor die and conductive terminals (e.g., leads) of the package. The thicknesses of these metal layers are generally limited by manufacturing processes and equipment, and in some cases, the metal layers are too thin to permit adequate current flow. This high resistance provided by the metal layers can result in unsatisfactory performance, particularly in power packages, as well as undesirable impacts on electro-migration.

This disclosure describes various examples of a semiconductor package that mitigates the challenges described above by including a plated metal layer that is plated on top of the highest metal layer of the package substrate. The plated metal layer is coupled to the highest metal layer of the package substrate, but it is separate and distinct from the highest metal layer. For example, the plated metal layer may be plated on only a portion of the highest metal layer. The plated metal layer, while distinct from the highest metal layer, abuts the highest metal layer and thus effectively increases the thickness of the highest metal layer. By effectively increasing the thickness of the highest metal layer, the total combined resistance of the metal layers in the substrate is substantially reduced, thereby permitting improved current flow and mitigating electro-migration. These features may be useful in any type of semiconductor package, and they may be particularly useful in power applications.

Figure 1A:
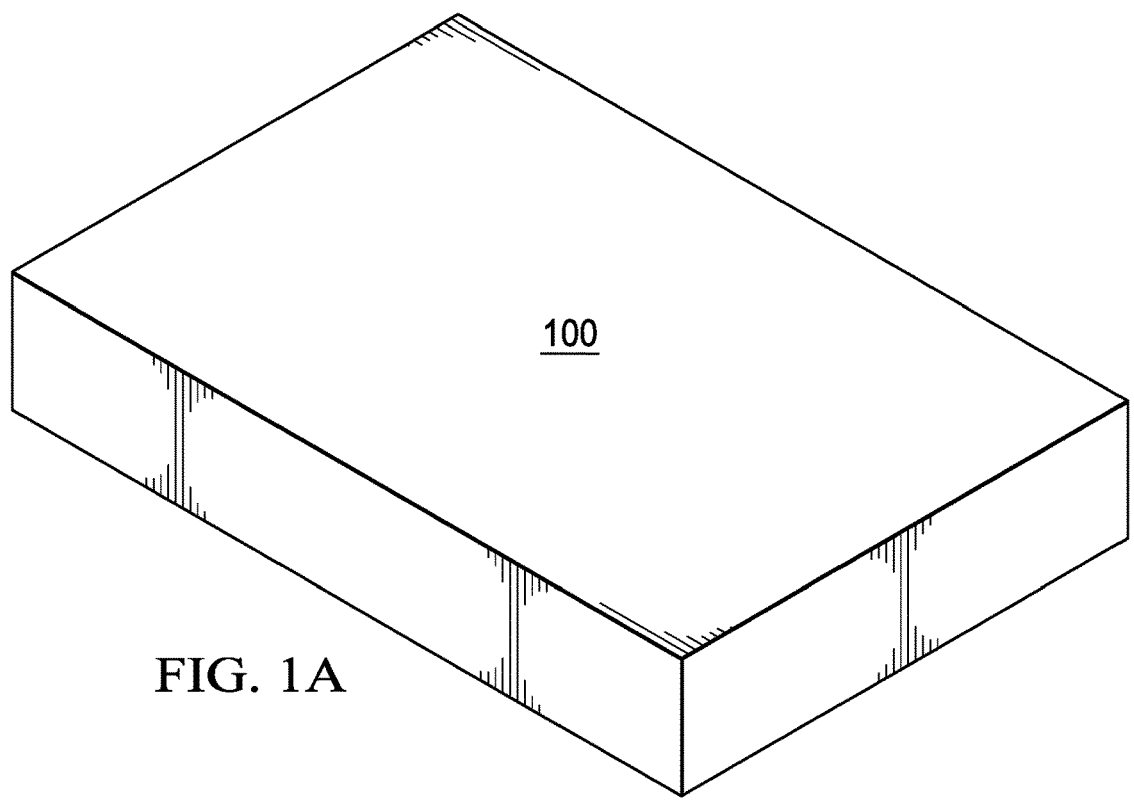
FIGS. 1A and 1B are perspective views of a semiconductor package having a plated metal layer, in accordance with various examples.
Figure 1B:
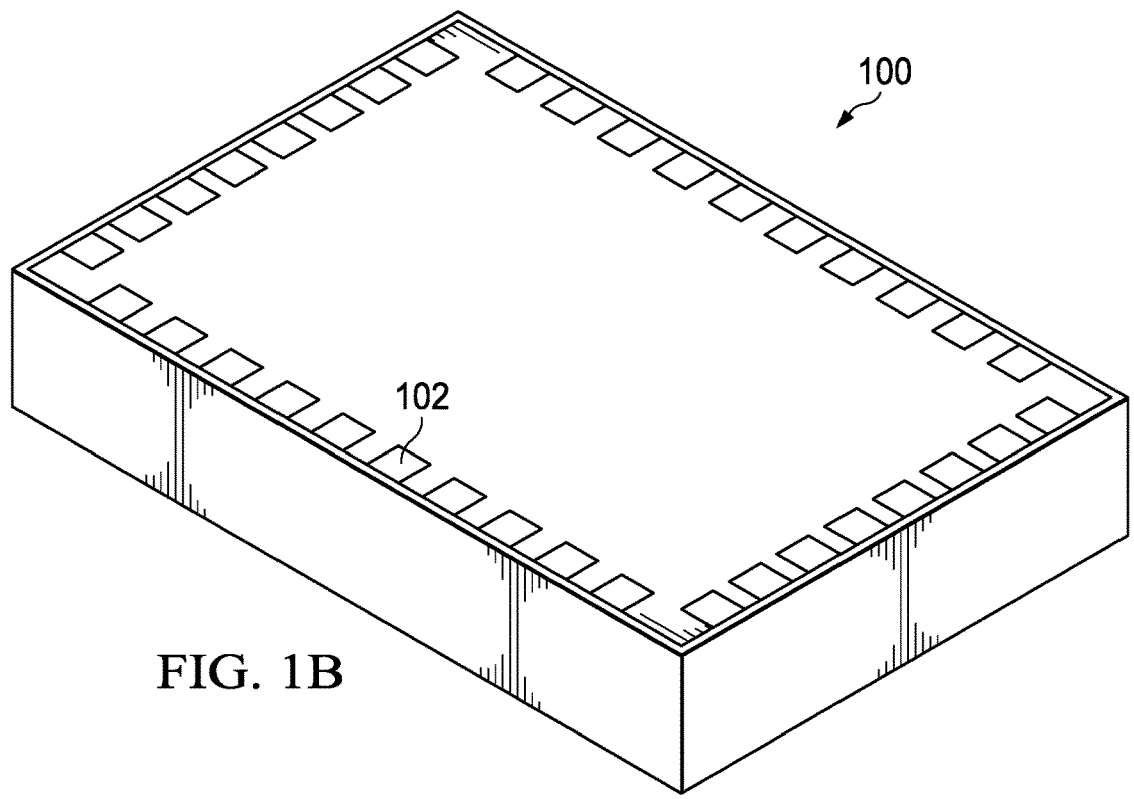

FIGS. 1A and 1B are perspective views of a semiconductor package 100 having a plated metal layer, in accordance with various examples. FIG. 1A shows a top side of the semiconductor package 100, and FIG. 1B shows a bottom side of the semiconductor package 100. FIG. 1B shows a metal layer 102 exposed to an exterior of the semiconductor package 100. The various portions of the metal layer 102 shown in FIG. 1B may be coupled to each other. In examples, a subset of the portions of the metal layer 102 are coupled to each other. In examples, none of the portions of the metal layer 102 are coupled to each other. Notwithstanding the particular manner in which the drawings depict the semiconductor package 100, the semiconductor package 100 may be any suitable type of package, such as a dual inline package (DIP), a quad flat no-lead (QFN) package, a package having gullwing style leads, a flip-chip style package, a ball grid array (BGA) package, a combination of one or more such package types, etc. Any type of package in which the above-described challenges are present may benefit from the structures and techniques described herein.

Figure 1C:
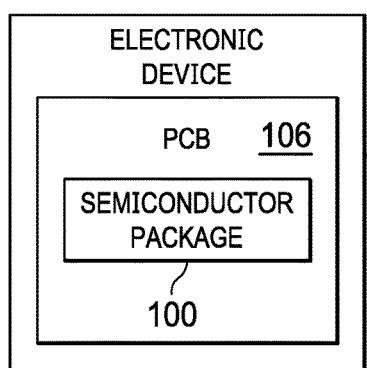
FIG. 1C is a block diagram of an example electronic device in accordance with various examples.

FIG. 1C is a block diagram of an electronic device 104 containing the semiconductor package 100, in accordance with various examples. In particular, the electronic device 104 may include a personal electronic device (e.g., smartphones, laptop computers, desktop computers, tablets, notebooks, artificial intelligence assistants), an electronic appliance (e.g., refrigerators, microwave ovens, toaster ovens, dishwashers), a networking or enterprise-level electronic device or system (e.g., servers, routers, modems, mainframe computers, wireless access points), an automobile or aviation device or system (e.g., control panels, entertainment devices, navigation devices, power electronics), or any of a variety of other electronic devices or systems. The electronic device 104 may include a printed circuit board (PCB) 106 and a semiconductor package 100 coupled to the PCB 106.

Figure 2:
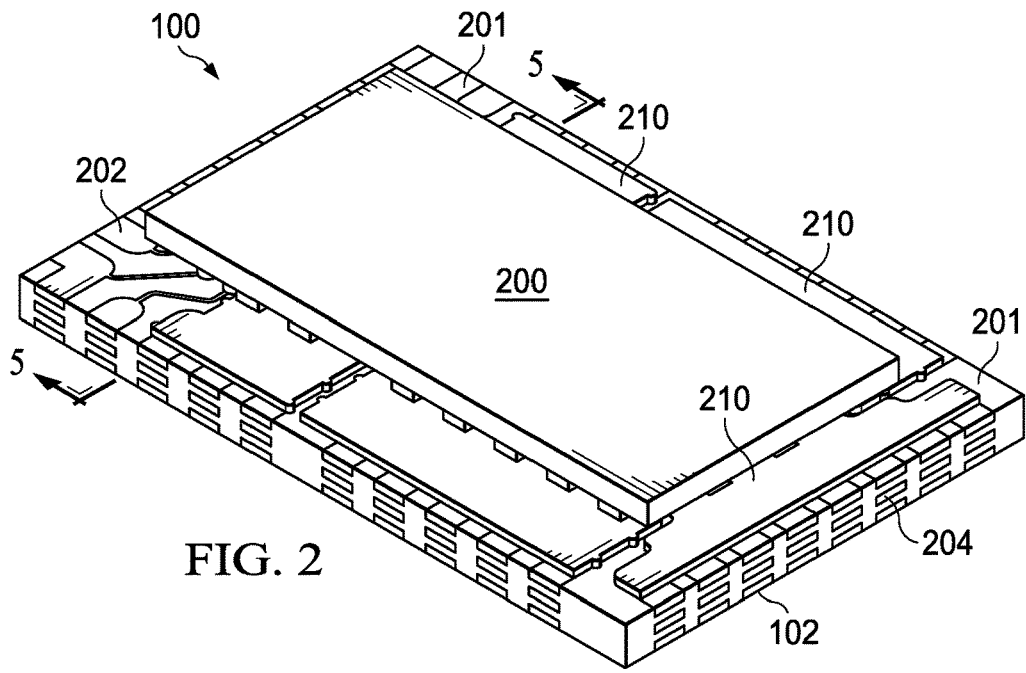
FIGS. 2-4 are perspective views of contents of a semiconductor package having a plated metal layer, in accordance with various examples.
Figure 3:
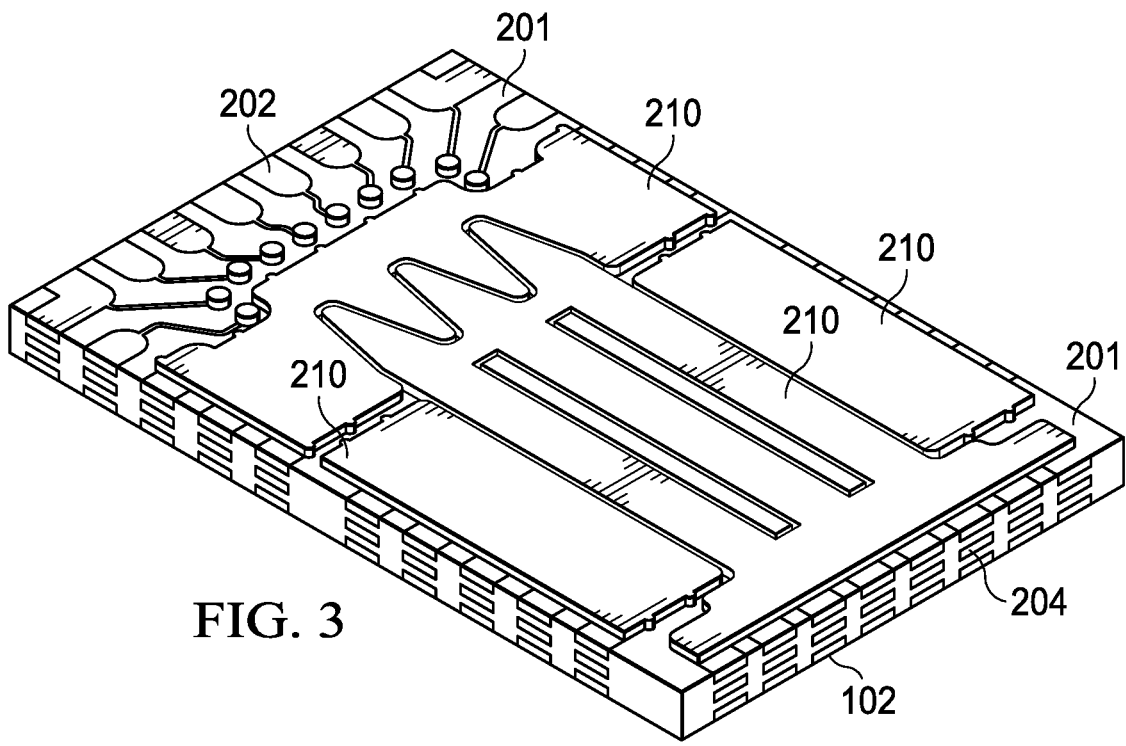
Figure 4:
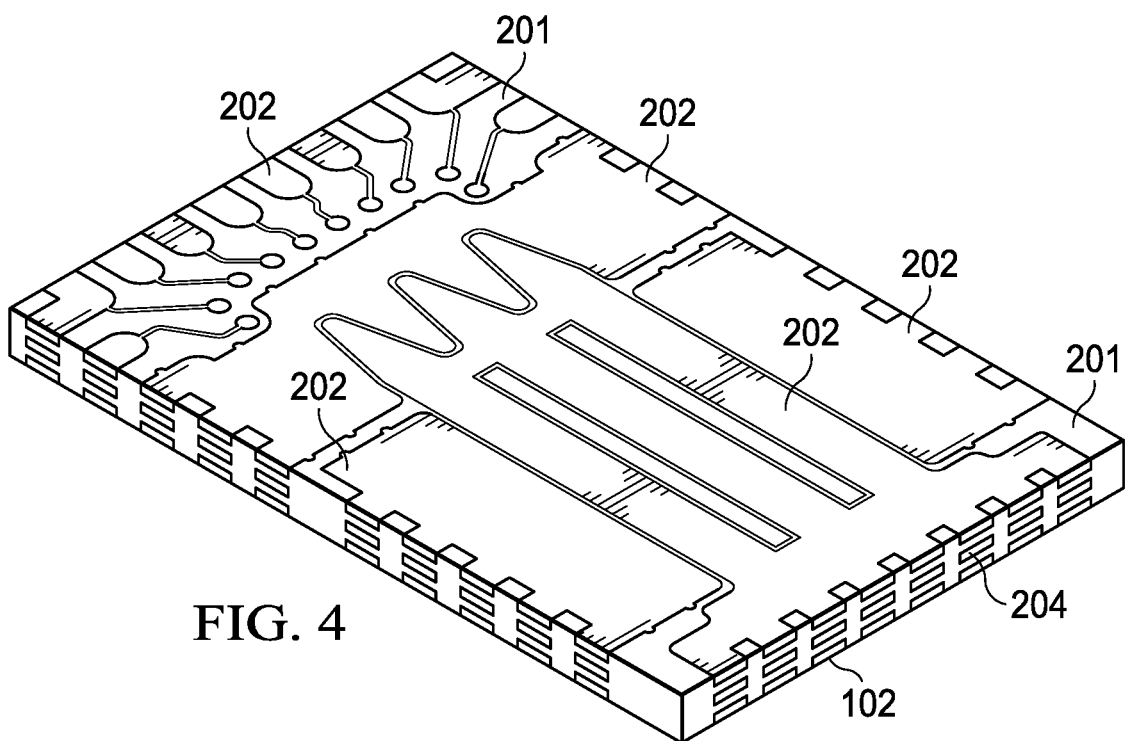

FIGS. 2-4 are perspective views of contents of the semiconductor package 100, in accordance with various examples. The semiconductor package 100 includes a semiconductor die 200. The semiconductor die 200 has a flip-chip orientation, meaning that the device side of the semiconductor die 200 in which circuitry is formed is facing downward. The device side of the semiconductor die 200 is coupled to a top surface of a plated metal layer 210. The plated metal layer 210 may be composed of a low resistivity metal, such as copper, aluminum, nickel, gold, or silver. The resistivity of the plated metal layer 210 is lower than $7 \times 10^{-8}$ Ohm-meters at 20 degrees Celsius, with a resistivity greater than this range resulting in an unacceptably high total resistance in the semiconductor package 100. A bottom surface of the plated metal layer 210 is coupled to a top surface of a metal layer 202. As described below, the plated metal layer 210 may be plated on the metal layer 202. Accordingly, while the plated metal layer 210 and the metal layer 202 are distinct and separate layers, they are coupled to each other. A bottom surface of the metal layer 202 is coupled to a top surface of a metal layer 204 by way of multiple vias (vias not expressly shown in FIG. 2). A bottom surface of the metal layer 204 is coupled to a top surface of the metal layer 102 (also shown in FIG. 1B and described above) by way of multiple vias (vias not expressly shown in FIG. 2). As described above, a bottom surface of the metal layer 102 is exposed to an exterior of the semiconductor package 100. The semiconductor package 100 includes a dielectric 201 (e.g., such as AJINOMOTO® build-up film (ABF)). A mold compound is included in the semiconductor package 100 but is not expressly shown in FIG. 2. The metal layers 102, 204, and 202 are part of a substrate called a multi-layer package substrate, because the substrate is in a package and the substrate includes multiple metal layers. The multi-layer package substrate also includes the dielectric 201. The multi-layer package substrate differs from a printed circuit board (PCB) because the multi-layer package substrate is within the semiconductor package 100, whereas the PCB is outside the semiconductor package 100. The multi-layer package substrate includes multiple metal layers that are separated by a solid, tangible dielectric 201, whereas the PCB may contain multiple layers of printed circuit board that may not be separated by a dielectric material other than air.

In examples, the metal layers 202, 204, and 102 abut the dielectric 201. In examples, a top surface of the metal layer 202 is approximately flush with a top surface of the dielectric 201. In examples, the bottom surface of the metal layer 102 is approximately flush with a bottom surface of the dielectric 201. In examples, each of the metal layers 202, 204, and 102 is co-planar with the dielectric 201, meaning that a horizontal plane coincides with the metal layer 202 and the dielectric 201, another horizontal plane coincides with the metal layer 204 and the dielectric 201, and another horizontal plane coincides with the metal layer 102 and the dielectric 201. In examples, the plated metal layer 210 is positioned above the top surface of the dielectric 201.

The patterns of the metal layers 202, 204, and 102 may be identical. In examples, the patterns of the metal layers 202, 204, and 102 are different. In examples, some, but not all, of the metal layers 202, 204, 102 have identical patterns.

In examples, the pattern of the plated metal layer 210 is identical to that of the metal layer 202. In such examples, the plated metal layer 210 abuts all or approximately all of the top surface of the metal layer 202. In examples, the pattern of the plated metal layer 210 differs from that of the metal layer 202. For instance, the plated metal layer 210 may abut some, but not all, of the metal layer 202, with the coincident portions of the plated metal layer 210 and the metal layer 202 being identical in pattern, but with at least one portion of the metal layer 202 not being covered by the plated metal layer 210. In examples, the plated metal layer 210 is strategically applied to power portions of the metal layer 202 that are connected to silicon nodes (e.g., voltage and ground terminals in the case of high power transistor drain and source terminals, or a switch node in a power converter) that use high current. In examples, the plated metal layer 210 is a continuous metal member, and in other examples, the plated metal layer 210 includes multiple distinct metal members.

In examples, the metal layers 202, 204, and 102 are approximately flush with side surfaces of the dielectric 201, as shown in FIG. 2. The plated metal layer 210 is not flush with the side surfaces of the dielectric 201 and, instead, it is recessed from the side surfaces of the dielectric 201 by a horizontal distance of at least 50 microns, with a distance lesser than this range being disadvantageous because of unacceptably increased difficulty during sawing operations (e.g., increased amount of metal to saw, thus slowing operations, reducing saw blade life, etc.). Distances lesser than the range described above are also disadvantageous because they increase overall package thickness, as the mold cap clamp used when injecting mold compound will contact the plated metal layer 210 instead of the metal layer 202.

The semiconductor die 200 may be coupled to the plated metal layer 210 using any suitable structures and techniques. For example, the semiconductor die 200 may be coupled to the plated metal layer 210 using copper pillars and solder bumps. For example, the semiconductor die 200 may be coupled to the plated metal layer 210 using solder bumps alone. Other structures and techniques are contemplated and included in the scope of this disclosure.

In some examples, the plated metal layer 210 has a thickness ranging from 30 microns to 60 microns. A thickness below this range does not acceptably improve overall resistance of the metal layers of the semiconductor package 100. In addition, a thickness below this range does not acceptably improve electromigration and acceptably reduce current crowding in the metal layers of the semiconductor package 100. Testing data demonstrate that parasitic resistance of semiconductor packages may be reduced by 33.9% in some designs implementing the plated metal layer described herein (e.g., a reduction from 1.74 milli Ohms to 1.15 milli Ohms). Conversely, a thickness above this range adds to semiconductor package 100 bulk and expense without providing a commensurate additional improvement in resistance, electromigration, and current crowding. Increasing the thickness of the metal layer 202 in lieu of or in addition to plating the plated metal layer 210 on the metal layer 202 is not feasible or acceptable, as doing so entails significant and expensive retooling of existing equipment and manufacturing processes. Accordingly, the thickness of the metal layer 202 may be in the range of 30 microns to 40 microns. The combined thickness of the plated metal layer 210 and the metal layer 202 is greater than the thickness of any of the remaining individual metal layers in the semiconductor package 100.

In operation, the plated metal layer 210, although a distinct and separate layer from the metal layer 202, effectively increases the thickness of the metal layer 202, since the plated metal layer 210 is plated directly on the metal layer 202. In this way, the current handling capability of the metal layer 202, and thus the total current handling capability of the semiconductor package 100, is increased. Total resistance of the semiconductor package 100 is decreased for the same reason, as is electromigration and current crowding. Because of these benefits, the semiconductor package 100 may find particular application and usefulness in power applications, and thus the semiconductor package 100 may be a power package of any suitable type. The scope of application, however, is not limited to power applications.

FIG. 3 is a perspective view of the structure of FIG. 2, with the semiconductor die 200 omitted to facilitate viewing of the remainder of the structure, and particularly of the plated metal layer 210. FIG. 4 is a perspective view of the structure of FIG. 3, with the plated metal layer 210 omitted to facilitate viewing of the remainder of the structure, and particularly of the metal layer 202. As shown in FIGS. 3 and 4, the plated metal layer 210 is plated on some, but not all, of the metal layer 202. The portion of the metal layer 202 on which the plated metal layer 210 is plated has a common structure (e.g., pattern) as the plated metal layer 210. The plated metal layer 210 is plated on at least 80% of the top surface of the metal layer 202 that is vertically aligned with the semiconductor die 200, with a lesser coverage area being disadvantageous because of unacceptably increased combined resistance of the metal layers in the semiconductor package 100, and with a coverage area greater than this range being disadvantageous because of substantially increased bulk and expense without a commensurate decrease in resistance, and further because of the possibility of the plated metal layer 210 extending to the side surfaces of the dielectric 201, thereby causing the sawing challenges described above. The total thickness of the structure shown in FIG. 4 ranges from 120 microns to 500 microns, with a thickness less than this range being disadvantageous because of poor structural integrity, and with a thickness greater than this range being disadvantageous because of increased cost and decreased yield.

Figure 5:
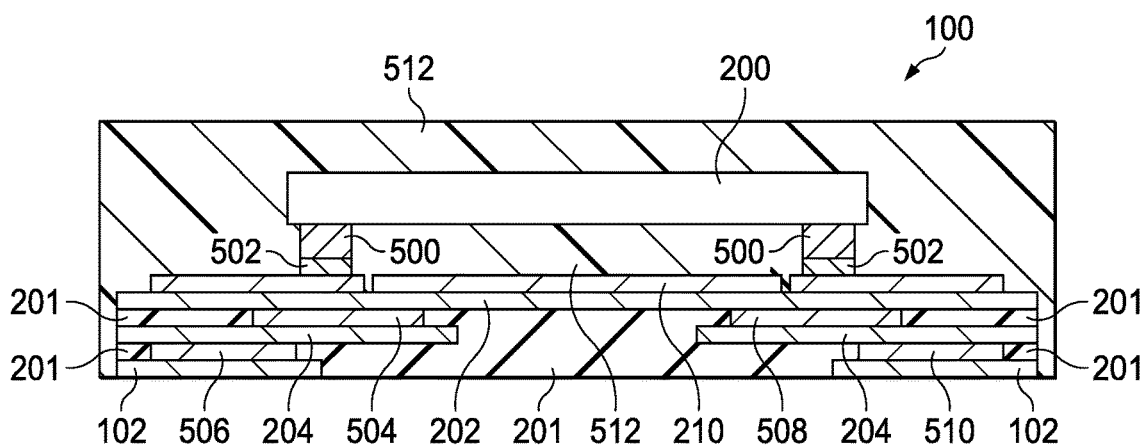
FIG. 5 is a profile cross-sectional view of a semiconductor package having a plated metal layer, in accordance with various examples.

FIG. 5 is a profile cross-sectional view of the semiconductor package 100, in accordance with various examples. The semiconductor die 200 may be coupled to the plated metal layer 210 by way of copper pillars 500 and solder bumps 502. Any suitable number of copper pillars 500 and solder bumps 502 may be used. In examples, the copper pillars 500 have a thickness ranging from 35 microns to 65 microns, with thicknesses below this range being disadvantageous due to mold fill challenges (e.g., the formation of air gaps in the mold compound), and with thicknesses above this range being disadvantageous because of a lack of co-planarity between the copper pillars 500 and due to structural integrity and reliability challenges. The semiconductor die 200, for example the device side of the semiconductor die 200, is vertically aligned with the plated metal layer 210, such that the semiconductor die 200 covers at least part of the plated metal layer 210.

The metal layer 202 is coupled to a portion of the metal layer 204 by way of a via 504, and the metal layer 202 is coupled to another portion of the metal layer 204 by way of a via 508. The portion of the metal layer 204 coupled to the via 504 may be coupled to a portion of the metal layer 102 by way of a via 506, and the portion of the metal layer 204 coupled to the via 508 may be coupled to a portion of the metal layer 102 by way of a via 510. The semiconductor package 100 includes a mold compound 512 that abuts the semiconductor die 200 (e.g., a top surface, a bottom surface, and/or one or more side surfaces of the semiconductor die 200), the copper pillars 500, the solder bumps 502, the plated metal layer 210, the metal layer 202, and, in examples, the dielectric 201. The thicknesses of the copper pillars 500 and the solder bumps 502 may be adjusted to provide increased clearance as described above, thus accommodating larger mold compound filler sizes (e.g., in the range of 60 to 80 microns) with few or no air gaps in the mold compound due to the increased clearance. The increased clearance is achieved between the bottom surface of the semiconductor die 200 and the top surface of the metal layer 202 in areas of the semiconductor package 100 where the plated metal layer 210 includes a horizontal gap or multiple horizontal gaps between the bottom surface of the semiconductor die 200 and the top surface of the metal layer 202.

Figure 6A:
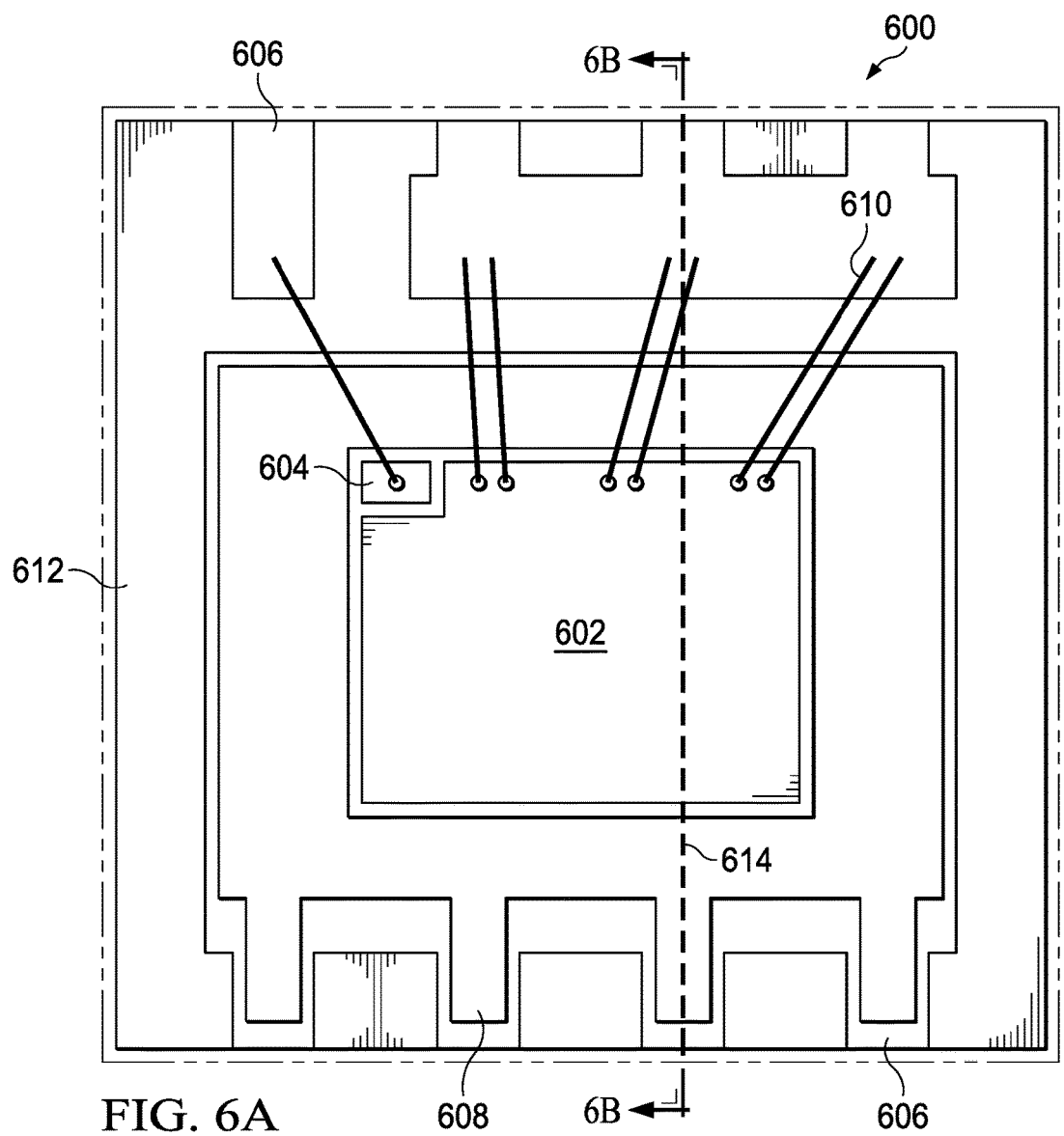
FIG. 6A is a top-down view of contents of a semiconductor package having a plated metal layer, in accordance with various examples.

FIG. 6A is a top-down view of contents of a semiconductor package 600 having a plated metal layer, in accordance with various examples. The semiconductor package 600 includes a semiconductor die 602 having a gate pad 604. The gate pad 604 may be, for instance, the gate pad of a power transistor (e.g., metal oxide semiconductor field effect transistor (MOSFET)), or the base of a power bipolar junction transistor (BJT). The semiconductor package 600 includes a metal layer 606. A plated metal layer 608 is plated on top of a portion of the top surface of the metal layer 606. Plated areas may include the drain or source nodes of a power MOSFET, or the collector or emitter of a power BJT. A dielectric 612 abuts the metal layer 606, and in examples, the top surface of the metal layer 606 is approximately flush with the top surface of the dielectric 612. In examples, the plated metal layer 608 is positioned above the top surface of the dielectric 612. The semiconductor package 600 may be a power transistor package (commonly used in power applications), in which current flows through the body of the semiconductor die 602, toward and through a bottom surface of the semiconductor die 602 and into the plated metal layer 608, which is positioned underneath the semiconductor die 602. The current may then flow laterally (horizontally) within the various metal layers and vias that abut and are co-planar with the dielectric 612. Wirebonds 610 couple the device side of the semiconductor die 602 and the gate pad 604 to the metal layer 606, as shown.

Figure 6B:
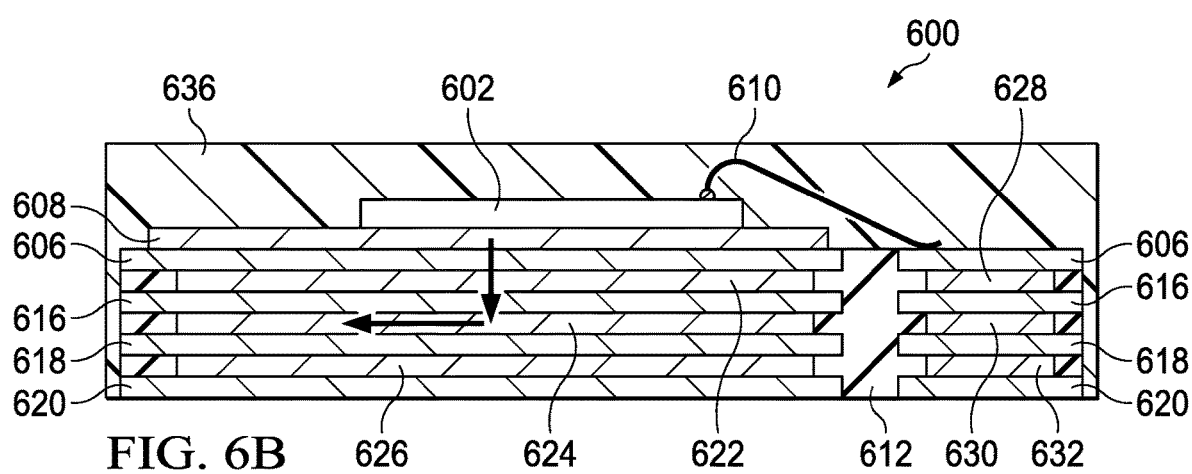
FIG. 6B is a profile cross-sectional view of a semiconductor package having a plated metal layer, in accordance with various examples.

FIG. 6B is an example profile cross-sectional view of the semiconductor package 600 along the line 614 shown in FIG. 6A. As shown, the semiconductor package 600 includes a metal layer 616 coupled to the metal layer 606 by way of a via 622; a metal layer 618 coupled to the metal layer 616 by way of a via 624; and a metal layer 620 coupled to the metal layer 618 by way of a via 626. The plated metal layer 608 is plated on the metal layer 606, as shown and as described above. Further, via 628 couples a segment of the metal layer 606 to a segment of the metal layer 616. A via 630 couples a segment of the metal layer 616 to a segment of the metal layer 618. A via 632 couples a segment of the metal layer 618 to a segment of the metal layer 620. The metal layer 620 is exposed to an exterior of the dielectric 612 and to an exterior of the semiconductor package 600. In examples, the bottom surface of the metal layer 620 is approximately flush with the bottom surface of the semiconductor package 600. A mold compound 636 covers the remaining structures of the semiconductor package 600. The dimensions and physical properties of the plated metal layer 608 are similar to those of the plated metal layer 210, and thus they are not described again here. The dimensions and physical properties of the remaining structures of the semiconductor package 600 are likewise similar to the corresponding structures of the semiconductor package 100, and thus are not described again here. In operation, the plated metal layer 608, while distinct and separate from the metal layer 606, nonetheless increases the effective thickness of the metal layer 606 and thus reduces the overall resistance of the metal layers in the semiconductor package 600. For similar reasons, electromigration and current crowding is reduced. Arrows 634 depict an example current flow path.

Figure 7A:
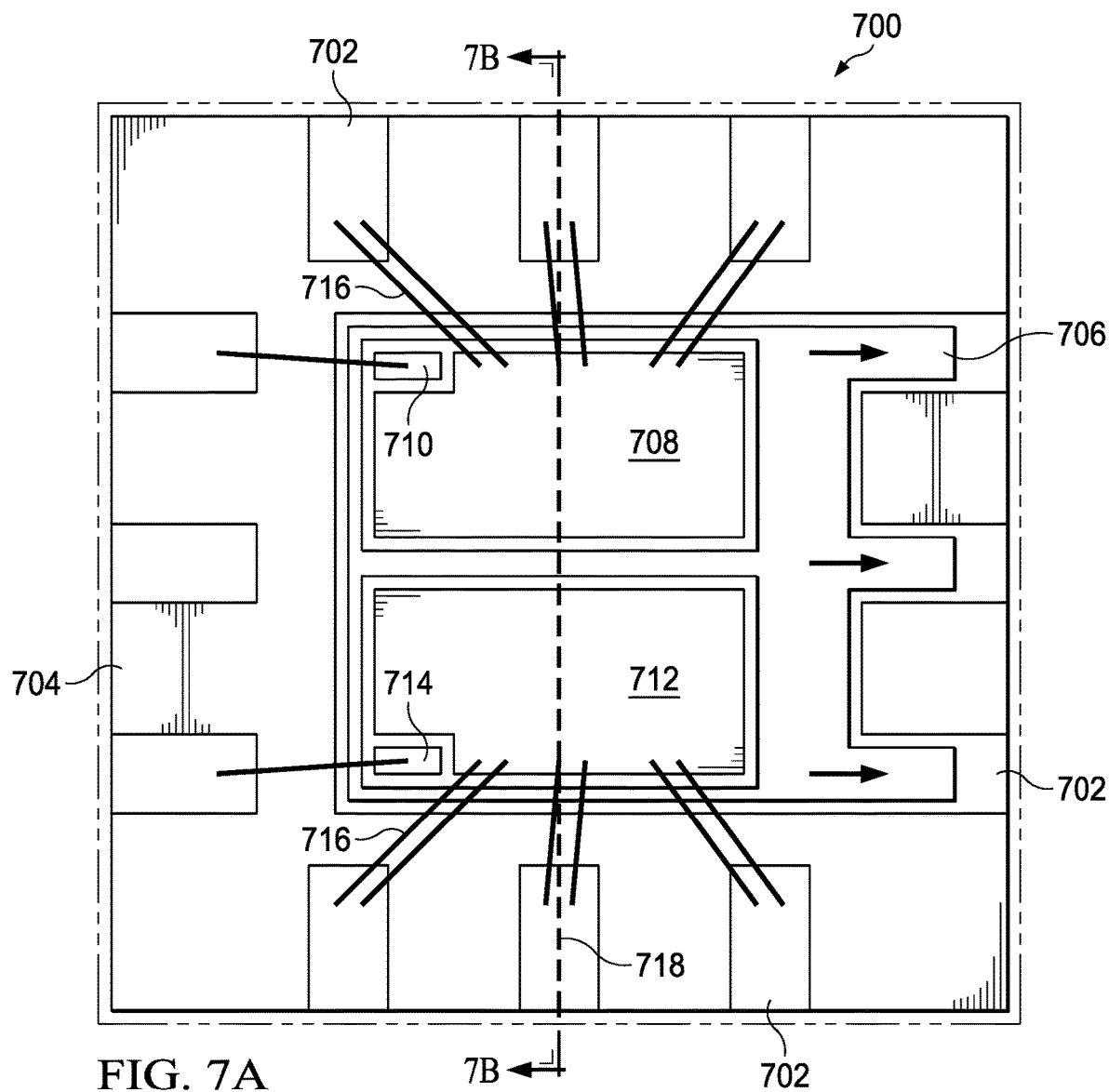
FIG. 7A is a top-down view of contents of a semiconductor package having a plated metal layer, in accordance with various examples.

FIG. 7A is another example semiconductor package similar to that of FIGS. 6A and 6B. In particular, FIG. 7A is a top-down view of contents of a semiconductor package 700 having a plated metal layer, in accordance with various examples. The semiconductor package 700 includes a metal layer 702, a dielectric 704 having a top surface that is approximately flush with the top surface of the metal layer 702, a plated metal layer 706 plated on the top surface of the metal layer 702, a semiconductor die 708 having a gate pad 710, a semiconductor die 712 having a gate pad 714, and wirebonds 716 coupling the metal layer 702 to the semiconductor dies 708 and 712, as shown. In examples, the semiconductor package 700 may be a dual die multi-chip module (MCM) power transistor type of package and may be suitable for use in power applications.

Figure 7B:
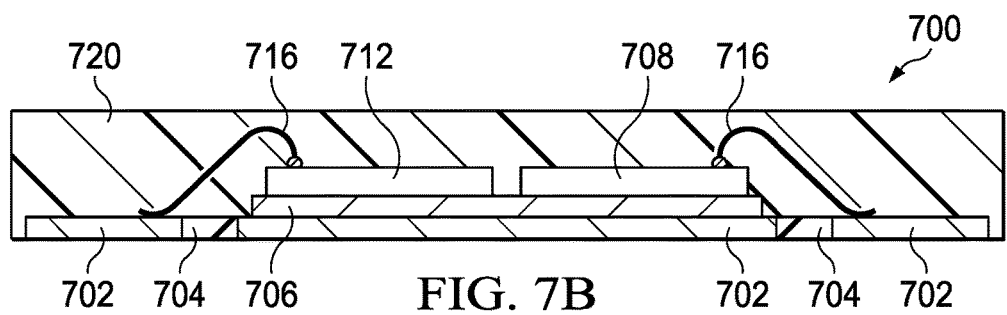
FIG. 7B is a profile cross-sectional view of a semiconductor package having a plated metal layer, in accordance with various examples.

FIG. 7B is a profile cross-sectional view of the semiconductor package 700 along the line 718 shown in FIG. 7A. As shown, the semiconductor package 700 includes a mold compound 720 covering the structures of FIG. 7A. The dimensions and physical properties of the various structures of the semiconductor package 700 are similar to those of the corresponding structures of the semiconductor package 700, and thus they are not repeated here. Further, the benefits attained by including the plated metal layer 706 are similar to those attained by including the plated metal layers described above, and thus they are not repeated here. Arrows 722 indicate lateral current flow, specifically, through the bodies of the semiconductor dies 708 and 712, through the bottom surfaces of the semiconductor dies 708 and 712, into the plated metal layer 706, and then laterally through the plated metal layer 706 and the metal layer 702.

Figure 8:
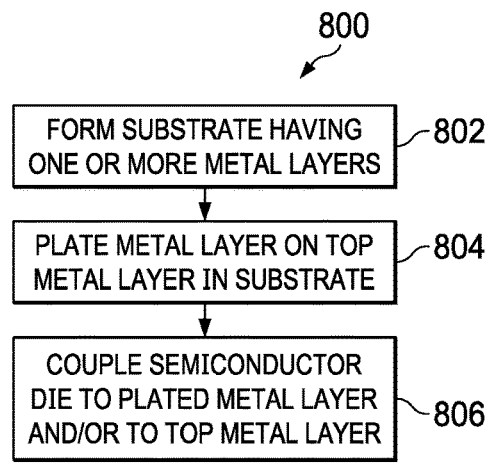
FIG. 8 is a flow diagram of a method for manufacturing a semiconductor package having a plated metal layer, in accordance with various examples.

FIG. 8 is a flow diagram of a method 800 for manufacturing a semiconductor package having a plated metal layer, in accordance with various examples. In examples, the method 800 includes forming a substrate having one or more metal layers (802). For example, referring to FIG. 5, a substrate may include the dielectric 201, the metal layers 102, 204, and 202, and the vias coupling these metal layers. For example, referring to FIG. 6B, the substrate may include the dielectric 612, the metal layers 606, 616, 618, and 620, and the vias coupling these metal layers. For example, referring to FIG. 7B, the substrate may include the dielectric 704 and the metal layer 702.

The method 800 includes plating a metal layer on the top surface of the top metal layer in the substrate (804). Examples of such plated metal layers include the plated metal layers 210, 608, and 706 described above. Any suitable plating technique(s) may be used, and any suitable metals and/or metal alloys may be used. In some examples, the plated metal layer is of the same composition as the top metal layer on which the plated metal layer is plated. The method 800 includes coupling the semiconductor die to the plated metal layer and/or to the top metal layer (806). In some examples, a die attach film (not expressly shown in the drawings above) may be used. Other techniques for coupling the semiconductor die to the plated metal layer are contemplated and included in the scope of this disclosure.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A semiconductor package, comprising:
 a multi-layer package substrate including:
  first and second metal layers, the first metal layer positioned above the second metal layer and coupled to the second metal layer by way of a via; and
  a dielectric covering at least part of the first and second metal layers and the via;

a plated metal layer plated on at least part of the first metal layer and positioned above the dielectric, a combination of the first metal layer and the plated metal layer being thicker than the second metal layer; and a semiconductor die having a device side, the device side vertically aligned with and attached to the plated metal layer.

2. The semiconductor package of claim 1, wherein a thickness of the plated metal layer ranges from 30 microns to 60 microns.

3. The semiconductor package of claim 1, further comprising a mold compound under the semiconductor die, wherein the mold compound includes a mold compound filler of 60 microns to 80 microns.

4. The semiconductor package of claim 1, wherein a bottom surface of the first metal layer is approximately flush with a top surface of the dielectric.

5. The semiconductor package of claim 1, wherein the plated metal layer is plated on power portions of the first metal layer.

6. The semiconductor package of claim 1, wherein a top surface of the first metal layer along a perimeter of the first metal layer is independent of the plated metal layer.

7. The semiconductor package of claim 6, wherein a length of a segment of the first metal layer that is independent of the plated metal layer is at least 50 microns.

8. A semiconductor package, comprising:
a dielectric;
a metal layer co-planar with and abutting the dielectric;
a plated metal layer plated on top of the metal layer and having a thickness ranging from 30 microns to 60 microns; and
a semiconductor die attached to the plated metal layer.

9. The semiconductor package of claim 8, wherein the plated metal layer is positioned above and external to the dielectric.

10. The semiconductor package of claim 8, wherein a combination of the metal layer and the plated metal layer is thicker than a second metal layer that is below the metal layer.

11. The semiconductor package of claim 8, wherein the plated metal layer reduces a total combined resistance of the metal layer and the second metal layer.

12. The semiconductor package of claim 8, wherein a device side of the semiconductor die is coupled to the plated metal layer.

13. The semiconductor package of claim 8, wherein the semiconductor die is vertically aligned with the plated metal layer.

14. The semiconductor package of claim 8, further comprising a mold compound under the semiconductor die, wherein the mold compound includes a mold compound filler of 60 microns to 80 microns.

15. The semiconductor package of claim 8, wherein a bottom surface of the metal layer is approximately flush with a top surface of the dielectric.

16. The semiconductor package of claim 8, wherein the plated metal layer is plated on power portions of the metal layer.

17. The semiconductor package of claim 8, wherein a top surface of the metal layer along a perimeter of the metal layer is independent of the plated metal layer.

18. A semiconductor package, comprising:
a substrate including first and second metal layers;
a plated metal layer plated on top of the first metal layer, a combined thickness of the plated metal layer and the first metal layer greater than a thickness of the second metal layer;
a semiconductor die having a device side and a non-device side, the non-device side attached to the plated metal layer; and
a conductive terminal exposed to an exterior of the semiconductor package, the conductive terminal coupled to the device side of the semiconductor die by way of a wirebond.

19. The semiconductor package of claim 18, wherein the plated metal layer has a thickness ranging from 30 microns to 60 microns.

20. The semiconductor package of claim 18, wherein a top surface of the first metal layer along a perimeter of the first metal layer is independent of the plated metal layer.

* * * * *